United States Patent
Hanley et al.

(10) Patent No.: US 10,020,110 B2
(45) Date of Patent: Jul. 10, 2018

(54) SURFACE MOUNT POWER INDUCTOR COMPONENT WITH STACKED COMPONENT ACCOMMODATION

(71) Applicant: EATON INTELLIGENT POWER LIMITED, Dublin (IE)

(72) Inventors: Renford Hanley, Wellington, FL (US); Guo Ouyang, Guangdong (CN); Dengyan Zhou, Shanghai (CN); Robert James Bogert, Lake Worth, FL (US); Yipeng Yan, Shanghai (CN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/155,523

(22) Filed: May 16, 2016

(65) Prior Publication Data

US 2016/0260536 A1    Sep. 8, 2016

Related U.S. Application Data

(63) Continuation of application No. PCT/CN2013/087690, filed on Nov. 22, 2013.

(51) Int. Cl.
| | |
|---|---|
| *H01F 27/29* | (2006.01) |
| *H01F 27/02* | (2006.01) |
| *H01F 17/04* | (2006.01) |
| *H01F 27/28* | (2006.01) |
| *H01F 27/24* | (2006.01) |
| *H05K 1/18* | (2006.01) |

(52) U.S. Cl.
CPC ............. *H01F 27/28* (2013.01); *H01F 17/04* (2013.01); *H01F 27/24* (2013.01); *H01F 27/29* (2013.01); *H01F 27/292* (2013.01); *H05K 1/182* (2013.01)

(58) Field of Classification Search
CPC ................................. H01F 27/292; H01F 5/04
USPC .................................... 336/83, 192, 221, 222
See application file for complete search history.

(56) References Cited

U.S. PATENT DOCUMENTS

| | | |
|---|---|---|
| 6,344,786 B1 | 2/2002 | Chin |
| 8,253,521 B2 | 8/2012 | Brennan |

(Continued)

FOREIGN PATENT DOCUMENTS

| | | | |
|---|---|---|---|
| CN | 102592781 A | * | 7/2012 |
| CN | 102612720 A |   | 7/2012 |

(Continued)

OTHER PUBLICATIONS

International Search Report and Written Opinion of International Application No. PCT/CN2013/087690, dated Aug. 25, 2014, 13 pages.

(Continued)

*Primary Examiner* — Tsz Chan
(74) *Attorney, Agent, or Firm* — Armstrong Teasdale LLP

(57) ABSTRACT

A surface mount power inductor component for a circuit board includes a magnetic body, at least one conductive coil, and surface mount terminations for completing an electrical connection between the conductive coil and the circuit board. One of the body and the surface mount terminations is configured to accommodate a separately provided component in a vertically stacked relation with the separately provided circuit board component being located between the circuit board and the body.

14 Claims, 5 Drawing Sheets

(56) References Cited

U.S. PATENT DOCUMENTS

| | | | | |
|---|---|---|---|---|
| 2010/0013587 A1* | 1/2010 | Yan | ............... | H01F 17/04 |
| | | | | 336/192 |
| 2010/0039200 A1* | 2/2010 | Yan | ............... | H01F 3/10 |
| | | | | 336/147 |
| 2011/0205008 A1* | 8/2011 | Brennan | ............ | H01F 27/2847 |
| | | | | 336/221 |
| 2012/0229986 A1* | 9/2012 | Huda | ............... | H05K 7/209 |
| | | | | 361/720 |
| 2014/0062437 A1* | 3/2014 | Malcolm | ............ | H02M 3/156 |
| | | | | 323/282 |
| 2014/0062446 A1* | 3/2014 | Ikriannikov | ............ | H02M 1/14 |
| | | | | 323/304 |
| 2014/0266086 A1* | 9/2014 | Ikriannikov | ............ | H01F 30/12 |
| | | | | 323/259 |

FOREIGN PATENT DOCUMENTS

| | | | |
|---|---|---|---|
| CN | 102763178 A | | 10/2012 |
| CN | 203552914 U | | 4/2014 |
| JP | 11299225 A | * | 10/1999 |
| JP | 2003188023 A | * | 7/2003 |

OTHER PUBLICATIONS

International Preliminary Report on Patentability for International Application No. PCT/CN2013/087690, dated Jun. 2, 2016, 7 pages.

\* cited by examiner

SURFACE MOUNT POWER INDUCTOR COMPONENT WITH STACKED COMPONENT ACCOMMODATION

CROSS REFERENCE TO RELATED APPLICATIONS

This application is a continuation application of International Application No. PCT/CN2013/087690.

BACKGROUND OF THE INVENTION

The field of the invention relates generally to the construction and fabrication of components for circuit board applications, and more specifically to the construction and fabrication of electromagnetic components such as power inductors for use on circuit boards.

Electronic power converters are known and in widespread use to convert electrical energy from one form to another. For example, power may be converted from a first direct current (DC) voltage to another direct current (DC) voltage, commonly referred to as a DC to DC voltage conversion. Power may also be converted from a first alternating current (AC) voltage to another direct current (DC) voltage using converter circuitry, commonly referred to as an AC to DC voltage conversion. Hence, power converters are often referred to as DC to DC power converters or AC to DC power converters.

Some types of electronic power converters include an inductor, sometimes referred to as a power inductor, that stores and releases electrical energy to and from the circuit. Such converters including power inductors are utilized in for, example, switched mode power supply systems that are electronically controlled and supply power, for example, to a variety of handheld electronic devices having an ever increasing number of features. As current flows through a winding in the inductor, the current flow generates a magnetic field that may be stored as magnetic energy in either a physical gap or a distributed gap of a magnetic core of the inductor. The stored magnetic energy may likewise induce current flow in the inductor and return electrical energy back to the circuit. For this reason, such power converter circuits and inductor components are sometimes referred to as power magnetics. Power magnetic converters may include, for example, boost converters, buck converters, and fly-back converters.

In view of the trend toward smaller and smaller electronic devices having ever more powerful features, demand for higher density of components on circuit boards has increased. To meet such demands, power inductors, like other components, have become increasingly miniaturized. There are practical challenges and tradeoffs, however, in providing increased power capabilities in components of smaller size. The electrical performance of conventional surface mount inductors is undesirably limited for certain power converter applications, particularly for relatively high current, high power applications. Improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
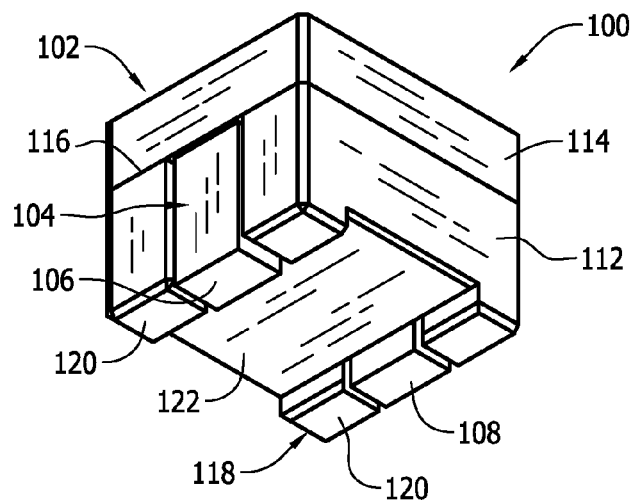
FIG. 1 is a bottom perspective view of a first exemplary embodiment of a surface mount power inductor.

Circuit board mounting density has long been a pressing concern to electronic device manufacturers. Mounting an increased number of electronic components in a selected area of a circuit board allows either more components to be provided on a circuit board or a desirable reduction of the size of the circuit board needed in any device. Electronic devices accordingly may have more powerful features or may become smaller. Recent trends toward reducing the size of the electronic devices while simultaneously providing more powerful devices and features has pressured electronic component manufacturers to reduce the size of circuit board components, including but not limited to magnetic components such as inductors. Smaller components occupy less space on a circuit board and in turn increase the circuit board mounting density.

In power converter circuitry, magnetic components such as power inductors present performance issues in certain applications as their size is reduced. The performance requirements of higher power, higher current applications are difficult to reconcile with the desire for increasingly miniaturized components. The smaller coils and smaller magnetic bodies of miniaturized power inductors can handle smaller currents well, but not larger ones. In higher current, higher power applications, larger coils are needed. In turn, higher current and larger coils require larger magnetic cores to store energy.

Conventionally, power inductor components, like other circuit board components, are mounted on a circuit board in a horizontally spaced relation from other components on the board. In the power converter example, a power inductor is mounted in a horizontally spaced, but nearby relation to an integrated circuit components providing power stage functionality. Thus, larger power inductors to meet increased power requirements are in conflict with the desire to increase circuit board density. A larger power inductor will occupy more area on the circuit board, not less.

Exemplary embodiments of power inductors are described below that overcome these and other disadvantages in the art. Power inductors are provided that are fully capable of meeting increased power and current demands of modern electronic devices while still offering overall space savings on circuit boards. This is achieved by configuring the power inductor with stacked component accommodation, such that instead of mounting the power inductor and another circuit board component side-by-side in a horizontally spaced relation as conventionally has been done, the power inductor component can be vertically stacked with another component, such that the other component extends between the circuit board and the power inductor. The other component may be nested within or underneath the power component when mounted to circuit board.

Because of the stacked component accommodation provided in the power inductors, the physical size of power inductors may be increased to accommodate larger coils and larger magnetic cores to more capably perform in higher power, higher current circuitry occupy. While the larger power inductors occupy an increased area on the circuit board, because the other component (e.g., an integrated circuit component) occupies a smaller area within the confines of the larger area occupied by the power inductor, space savings on the circuit board are still achievable. Method aspects will be in part apparent and in part discussed in the description below.

Figure 4:
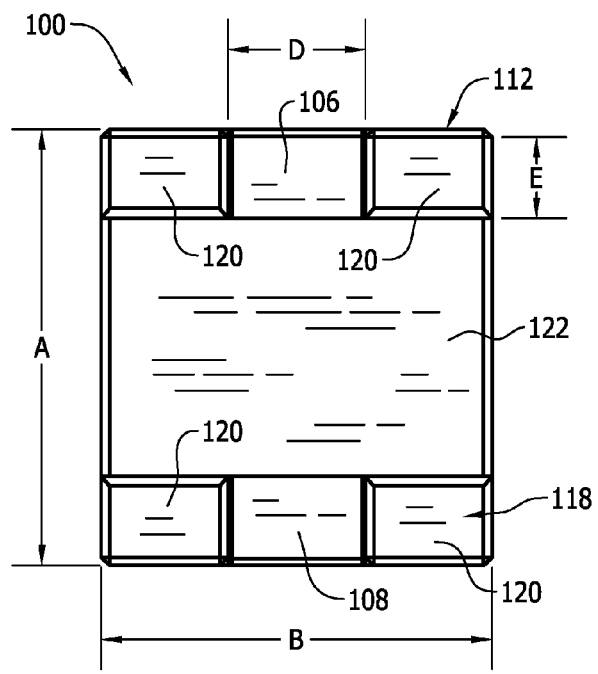
FIG. 4 is a bottom view of the power inductor component shown in FIG. 1.
Figure 5:
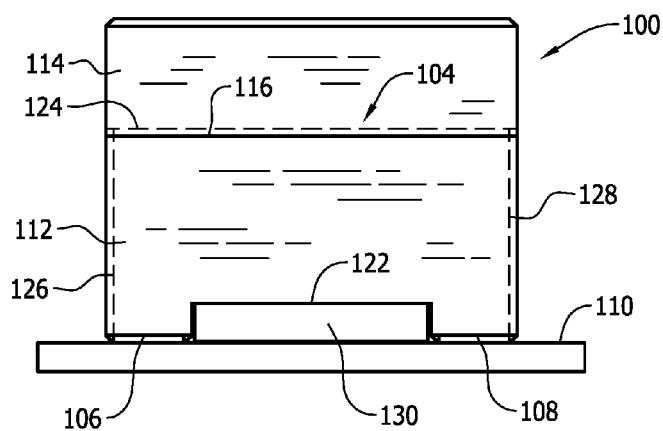
FIG. 5 is a side view of a component assembly including the power inductor component shown in FIGS. 1-4 mounted to a circuit board in stacked relation with another circuit board component.

Turning now to FIGS. 1-5, a first embodiment of a power inductor 100 is illustrated. The power inductor 100 generally includes a magnetic body 102, sometimes referred to as a core, a coil 104 (FIGS. 1 and 2), and surface mount terminations 106 and 108 (FIGS. 1 and 4). The surface mount terminations 106, 108 complete electrical connections to circuit traces or conductive paths of a circuit board 110 (FIG. 5). The electrical connections to the circuit path may be established via soldering to complete a circuit path through the coil 104 of the inductor component 100.

Figure 2:
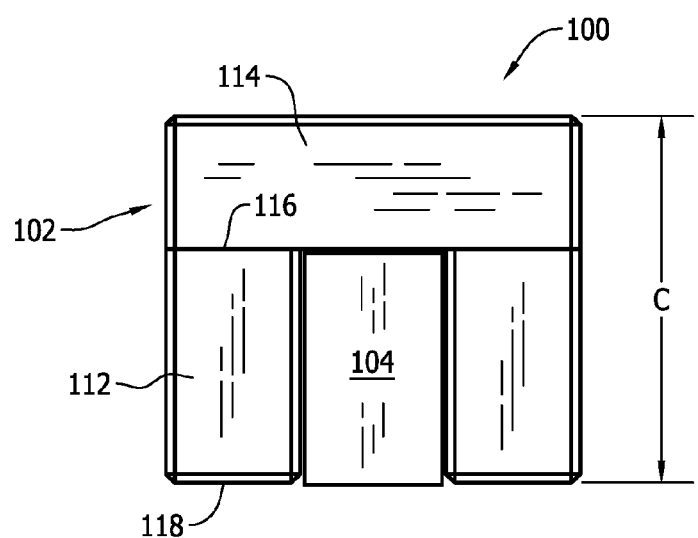
FIG. 2 is a first side elevational view of the power inductor component shown in FIG. 1.
Figure 3:
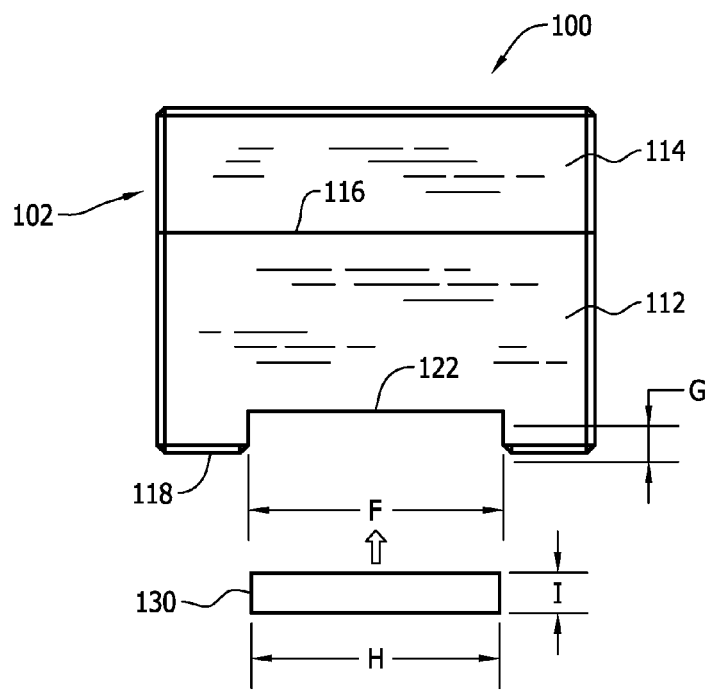
FIG. 3 is a second side elevational view of the power inductor component shown in FIG. 1.

The magnetic body 102 in the example shown is fabricated from a first magnetic core piece 112 and a second magnetic core piece 114 having a combined height dimension C as shown in FIG. 2. The magnetic body may include a physical gap 116 for energy storage. The core pieces 112, 114 may be fabricated from suitable magnetic materials known in the art. Exemplary magnetic materials include magnetic powder particles such as, in various embodiments, Ferrite particles, Iron (Fe) particles, Sendust (Fe—Si—Al) particles, MPP (Ni—Mo—Fe) particles, HighFlux (Ni—Fe) particles, Megaflux (Fe—Si Alloy) particles, iron-based amorphous powder particles, cobalt-based amorphous powder particles, or other equivalent materials known in the art. When such magnetic powder particles are mixed with a polymeric binder material the resultant magnetic material may exhibit distributed gap properties that avoids any need to physically gap or separate different pieces of magnetic materials. For high current applications, a pre-annealed magnetic amorphous metal powder may be considered advantageous.

For power inductor applications, metal powder materials may be preferred over ferrite materials for use as the magnetic powder materials in higher power inductor applications because metal powders, such as Fe—Si particles have a higher Bsat value. The Bsat value refers the maximum flux density B in a magnetic material attainable by an application of an external magnetic field intensity H. A magnetization curve, sometimes referred to as a B-H curve wherein a flux density B is plotted against a range of magnetic field intensity H may reveal the Bsat value for any given material. The initial part of the B-H curve defines the permeability or propensity of the material to become magnetized. Bsat refers to the point in the B-H curve where a maximum state of magnetization or flux of the material is established, such that the magnetic flux stays more or less constant even if the magnetic field intensity continues to increase. In other words, the point where the B-H curve reaches and maintains a minimum slope represents the flux density saturation point (Bsat).

Metal powder particles, such as Fe—Si particles have a relatively high level of permeability, whereas ferrite materials such as FeNi (permalloy) have a relatively low permeability. Generally speaking, a higher permeability slope in the B-H curve of the metal particles used, the greater the ability of the magnetic core to store magnetic flux and energy at a specified current level, which induces the magnetic field generating the flux.

The first core piece 112 in the example shown includes a bottom side 118 that abuts the circuit board 110 in use, and the surface mount terminals 106, 108 are exposed on the bottom side 118 for mounting to the circuit board 110. The bottom side 118, as best seen in FIG. 4) has a length dimension A and a width dimension B, the product of which defines a first area that the power inductor 100 occupies on the circuit board 110 when mounted. The bottom side 118 further includes a bottom surface defining a terminal surface 120 on each opposing lateral side edge of the bottom side 118, and a component accommodation surface 122 extending therebetween. The component accommodation surface 122 extends in a spaced relation from, but extends generally parallel to, the terminal surface 120. In the illustrated example, the component accommodation surface 122 is recessed relative to the terminal surface 120, such that when the terminal surface 120 is abutted in surface contact with the circuit board 110, the component accommodation surface 122 is spaced from the circuit board 110. The component accommodation surface 122 defines a channel or space on the bottom side 118 of the body 102 in which another component 130 may reside, with the component 130 being in a vertically stacked arrangement with the power inductor 100 as shown in FIG. 5.

The terminal surface 120 in the example shown extends at the four corners of the bottom side 118, and the surface mount terminations 106 and 108 extend therebetween on opposing edges of the bottom side 118. The surface mount terminations 106 and 108 define surface mount areas identified with dimensions D and E in FIG. 4. The dimensions D and E are selected in view of the high current demands of the power inductor application, and in contemplated embodiments are larger than has been conventionally provided in more recent miniaturized magnetic component constructions. The terminal surfaces 120 also share the dimension E in the embodiment illustrated.

The component accommodation surface 122 extends between the terminal surfaces 120 and the surface mount terminations 106, 108. In the example, shown, the component accommodation surface 122 has a length dimension F (FIG. 3) that is smaller than the dimension A (FIG. 4) of the bottom side. Specifically, the dimension F is equal to the dimension A minus the dimension E of the first terminal surface 120 and minus the dimension E of the opposing terminal surface 120. The component accommodation surface 122 also has a width dimension equal to the dimension B of the bottom side 118 (FIG. 4), and a height dimension G (FIG. 3) that defines the vertical spacing with the circuit board 110. Accordingly, the component accommodation surface 122 defines a component accommodation area that is within the confines of the larger area of the bottom side 118 including the terminal surfaces 120 and the surface mount terminations 106, 108. The height dimension G, in combination with the component accommodation area, defines a volume or three dimensional space that is sufficient to receive the other component 130. The component accommodation area is selected in view of the length, width, and height dimensions of the other component 130. The width and height dimensions of the component 130 are indicated with dimensions H and I in FIG. 3, and the length dimension in contemplated embodiments is less than the dimension A (FIG. 4) on the bottom side 118.

The coil 104 shown in FIGS. 1 and 4 (and also in phantom in FIG. 5) is formed from a conductive material and in the example shown includes a horizontally extending main winding section 124, opposing vertical winding sections 126 and 128 at either opposing end of the main winding section, and the surface mount terminations 106 and 108 as seen in FIG. 5. The coil 104 extends in a C-shape with the ends of the coil 104 inwardly turned to define the surface mount terminations 106 and 108. The coil 104, as can be seen in FIG. 5, completes less than one complete turn of an inductor winding, and is beneficially provided for certain high current, high power applications. The coil 104 has a cross sectional area selected for the current requirements at hand for the power application, and the integrally formed surface mount terminations 106, 108 provide a sufficient area or footprint to ensure reliable electrical connection to the circuit board 110. While a single coil 104 is shown in the exemplary embodiment depicted, more than one coil may be provided in further and/or alternative embodiments.

While a specific coil configuration including integrally formed surface mount terminations has been described, other configurations are of course possible and may be utilized in other embodiments. Alternative coil configurations may include any number of turns, including fractional or partial turns less than one complete turn as in the coil 104 or more than one complete turn, to achieve a desired inductance value of the inductor component. As non-limiting examples, the turns or loops in a coil winding may include a number of straight conductive paths joined at their ends, curved conductive paths, spiral conductive paths, serpentine conductive paths or still other known shapes and configurations. Coils may also be formed as generally planar elements, or may alternatively be formed as a three dimensional, free standing coil element. As those in the art will appreciate, an inductance value of the winding of a coil depends primarily upon the number of turns completed in the winding, the specific conductive material(s) used to fabricate the coil, and the cross sectional area of the coil winding. As such, inductance ratings of the power inductor component 100 may be varied considerably for different applications by varying the number of turns in the winding, the arrangement of the turns, and the cross sectional area of the coil turns.

The second magnetic core piece 114 in the embodiment shown is generally rectangular, and is bonded to the first magnetic core piece 112 such that the main winding section 124 of the coil 104 extends between the two core pieces 112 and 114. While a two piece core construction having core pieces with different shapes is described, in other embodiments the core pieces could have the same shape. A single core piece construction could alternatively be used in still another embodiment.

The component 130 may in contemplated embodiments be an integrated circuit (IC) component configured for power stage functionality in a power converter application. The IC component 130 may include switching and control components that, in combination with the power inductor 100, provide power converter functionality. As non-limiting examples, the IC component 130 may configured to provide boost converter, buck converter, or fly-back converter functionality. Other types of voltage regulation are likewise possible, as well as other types of IC components providing different structure and functionality to a circuit board. Still further, non-IC components may be accommodated by the power inductor 100. Any other circuit board component desired having dimensions compatible with the bottom side 118 and the recessed accommodation surface 122 may be utilized.

Also, while described in the context of power inductor applications, the vertical stack accommodation feature is not limited to power inductor applications, and as such the component 100 may be configured as another type of inductor or as another type of surface mount component. For example, a transformer component could be provided with a similar vertical stack accommodation feature. As another example, a circuit protection fuse, or a surge suppressor component may be provided with a similar vertical stack accommodation feature. Still other variations are possible. Depending on the type of component desired, the body 102 may or not be fabricated from magnetic materials, and may or may not be formed in two pieces.

In the assembly shown in FIG. 5, the vertical stack accommodation effectively reduces a voltage regulator footprint on the circuit board 110 in a power magnetics application without sacrificing electrical performance. While the inductor 100 is larger than many conventional surface mount inductor components, the stacked arrangement with the IC component 130 between the inductor 100 and the circuit board 110 actually occupies less space on the circuit board 110 than a smaller inductor and the IC component would occupy if mounted horizontally in a spaced apart arrangement on the circuit board per conventional techniques. Also, the vertical stacked arrangement provides additional benefit in that it allows for short conductive paths between the components 100 and 130 on the circuit board 110. The shorter paths on the boards slightly reduce power losses that longer paths would inevitably introduce.

Figure 10:
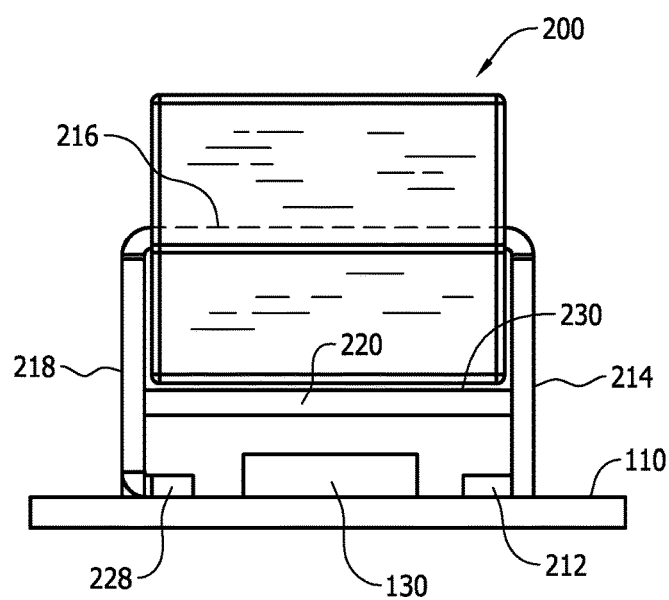
FIG. 10 is a side view of a component assembly including the component shown in FIGS. 6-9 mounted to a circuit board in stacked relation with another circuit board component.

FIGS. 6-10 illustrate a second exemplary embodiment of a surface mount power inductor component 200 that also offers vertical stack accommodation with the component 130 on a circuit board 110 as best shown in FIG. 10.

The component 200 includes a body 202, sometimes referred to as a magnetic core, which in exemplary embodiment may be defined by a first piece 204 and a second piece 206 bonded to another and encasing at least a portion of a coil 208. The first and second core pieces 204, 206 are formed from magnetic materials such as those described above, and are formulated to provide a desired relative magnetic permeability for a power inductor application. In the illustrated embodiment, the core pieces 204, 206 are similarly sized and shaped, and the body 202 may include a physical gap 210 extending between the core pieces 204 and 206. Depending on the magnetic materials utilized, however, the gap 210 may be considered optional in some embodiments. Also, while two core pieces are shown in the example of the component 200, single piece core constructions are possible and may be provided in other embodiments.

The coil 208 as shown is fabricated from a conductive material and defines a winding completing more than one complete turn of an inductor winding. Specifically, the exemplary coil 208 includes a first surface mount terminal 212, a vertical winding section 214 extending from the surface mount terminal 212, a first horizontal winding section 216 (shown FIG. 9 and in phantom in FIG. 10), a second vertical winding section 218, a second horizontal winding section 220, a third vertical winding section 222, a third horizontal winding section 224 (shown in FIG. 9), a fourth vertical winding section 226, and a second surface mount terminal 228. The coil winding and its sections 214, 216, 218, 220, 222, 224 and 226 wrap around the respective sides of the first core piece 204, with the winding sections 216 and 224 extending between the first and second core pieces 204 and 206. The surface mount terminations 212 and 228 are inwardly turned and generally coplanar to one another in spaced apart relation to the bottom side surface 230. The surface mount terminations 212 and 228 may be surface mounted to conductive circuit traces or circuit paths on a circuit board using known techniques such as soldering to complete a circuit through the coil 208.

The coil 208 is provided with a cross-sectional area selected with the current requirements in mind for the power inductor application, and the coil is integrally provided with the surface mount terminations 212, 228. While an exemplary coil winding configuration is shown, other configurations are of course possible. As those in the art will appreciate, an inductance value of the winding of a coil depends primarily upon the number of turns completed in the winding, the specific conductive material(s) used to fabricate the coil, and the cross sectional area of the coil winding. As such, inductance ratings of the power inductor component 200 may be varied considerably for different applications by varying the number of turns in the winding, the arrangement of the turns, and the cross sectional area of the coil turns. Also, more than one coil could be provided in the component 200 if desired.

Figure 6:
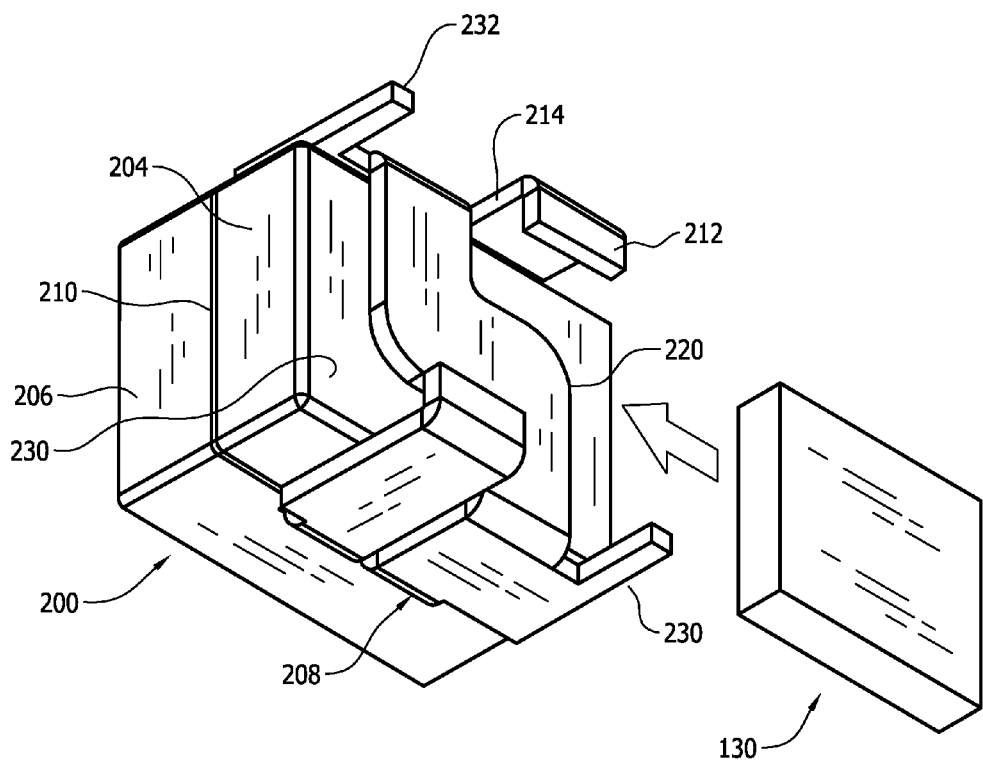
FIG. 6 is a bottom perspective view of a second exemplary embodiment of a surface mount power inductor.
Figure 7:
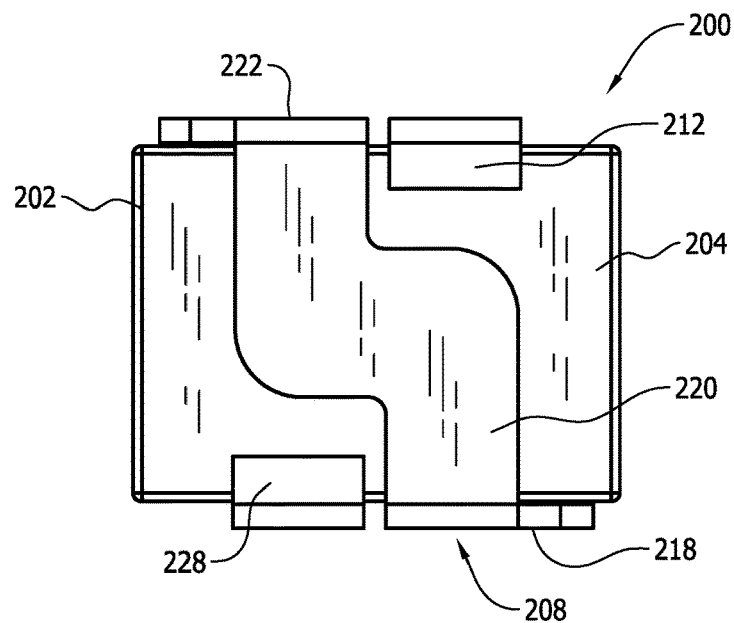
FIG. 7 is a bottom view of the power inductor component shown in FIG. 6.
Figure 8:
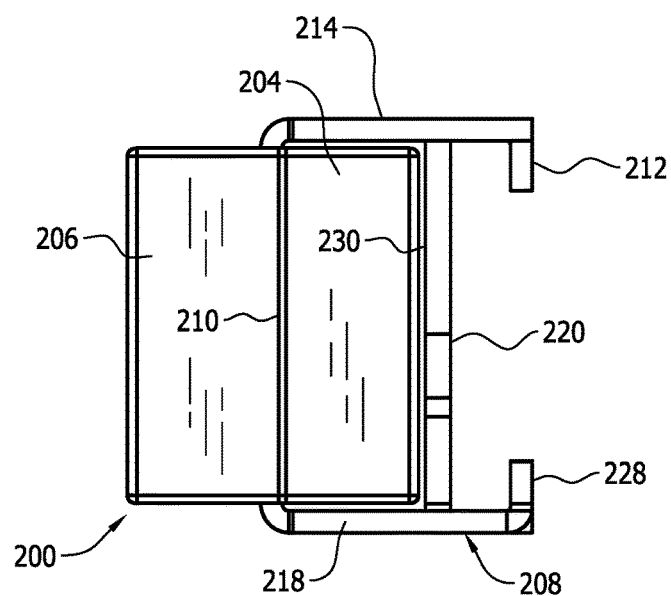
FIG. 8 is a first side elevational view of the power inductor component shown in FIG. 6.
Figure 9:
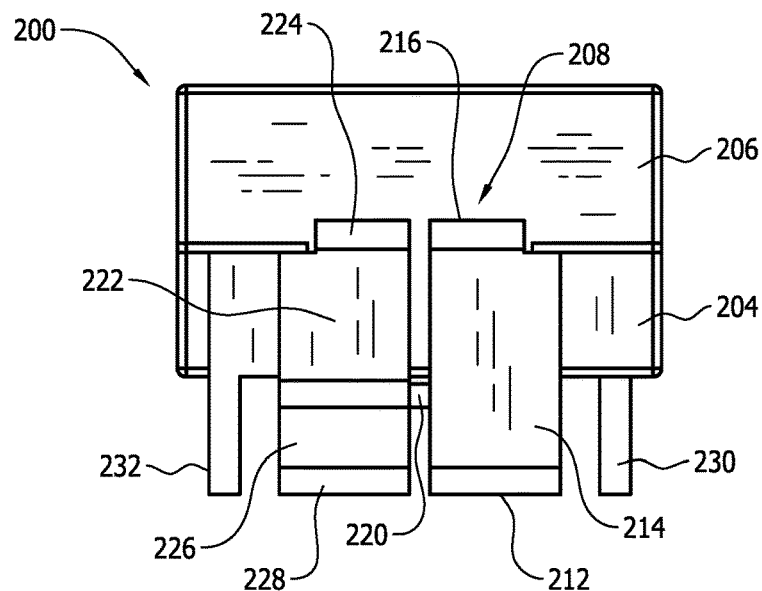
FIG. 9 is a second side elevational view of the power inductor component shown in FIG. 6.

The surface mount terminations 212, 228 are, as best seen in FIGS. 6, 8 and 10 vertically spaced apart from a bottom side surface 230 of the body 202, and more specifically of the magnetic core piece 204. As such, the component body 202 is elevated from the circuit board 110 in use as shown in FIG. 10. A three dimensional space is defined between the surface mount terminations 212, 228 and the bottom side surface 230 such that the other component 130 can be accommodated in a vertically stacked relation in between the component body 202 and the circuit board 110 when mounted thereto. Like the first component 100, the length, width, and height of the other component 130 is such that the second component 130 can be received in the space between the surface mount terminations 212, 228 and the body 202. Also like the component assembly shown in FIG. 5, the other component 130 in the assembly shown in FIG. 10 defines a smaller area on the circuit board 110 that is a portion of the larger area occupied by the component 200. Even though the physical package size of the inductor 200 is enlarged, space savings on the circuit board 110 are still realized because the other component 130 is mounted to the board vertically beneath the inductor 200, rather than horizontally beside it per conventional practices As best seen in FIG. 6, the coil 208 may also include support legs 230, 232 integrally formed therewith and extending in spaced relation from the surface mount terminals 212, 228 in a direction perpendicular to the bottom side surface 230. The support legs 232, 236 extend for a distance from the bottom side 230 equal to the distance at which the surface mount terminals 212, 228 extend. The support legs 230, 232 may rest upon the circuit board 110 and provide additional stability for mounting operations. In combination with the surface mount terminals 212, 228, the support legs 230, 232 provide stable support for the component 200 on the surface of the board 110 and simplify establishing electrical connections of the surface mount terminals 212, 228 to the surface of the board 110. In contemplated embodiments, the support legs 230, 232 serve mechanical purposes to provide a more stable structure, rather than an electrical purpose, and thus do not themselves establish electrical connection with the circuit board 110. In some embodiments, and depending on the coil configuration(s) provided, the support legs 230, 232 may be considered optional. Likewise, while support legs integrated in the coil 208 have been described, support legs or other support features could be integrated into the construction of the body 202 or otherwise provided by separately provided support components. Numerous variations are possible in this regard, The benefits of the elevated body 202 via the spaced surface mount terminals 212, 228 are similar to the benefits of the recessed accommodation area of the component 100 described above, and likewise are not necessarily limited to power inductor components. Various different types of inductor components and non-inductor circuit board components may utilize similar features with similar benefit. For example, a transformer component could be provided with a similar vertical stack accommodation feature having a body elevated from a circuit board. As another example, a circuit protection fuse or a surge suppression component may be provided with a similar vertical stack accommodation feature. Still other variations are possible. Depending on the type of component desired, the body 202 may or not be fabricated from magnetic materials, and may or may not be formed in two pieces.

It is contemplated that in still other embodiments, combinations of the vertical stack accommodation features are possible that combine the features described in relation to the components 100 and 200. That is, the same component may utilize a recessed component accommodation area and surface mount terminals spaced from the magnetic body to elevate the component body and define a three dimensional space in which another component may be received. Part of another component may be accommodated by the recessed component accommodation area and part of the other component may be accommodate by the spaced surface mount terminals elevating the component body from the circuit board. The accommodation areas defined by the recessed component accommodation area and the spaced surface mount terminals elevating the component body from the circuit board may be the same or different in such an embodiment.

The benefits of the invention are now believed to have been amply illustrated in relation to the exemplary embodiments disclosed.

An embodiment of a surface mount component for a circuit board has been disclosed, including: a body; and surface mount terminations for completing an electrical connection to the circuit board, wherein one of the body and the surface mount terminations is configured to accommodate a separately provided circuit board component in a vertically stacked relation to the body, and wherein the separately provided circuit board component is located between the circuit board and the body.

Optionally, the body may define a recessed area dimensioned to accommodate the separately provided surface mount component. The body may have a bottom surface, wherein the surface mount terminations are spaced from the bottom surface, and whereby the bottom surface may be elevated from the circuit board to define an area dimensioned to accommodate the separately provided surface mount component. The body may be magnetic, and may include a first magnetic core piece and a second magnetic core piece. The body may also include at least one physical gap.

The body may operationally include at least one conductive coil. The at least one conductive coil may define more than one complete turn of an inductor winding. The at least one conductive coil may alternatively define less than one complete turn of an inductor winding. The surface mount terminations may be integrally provided on opposing ends of the at least one conductive coil. The coil may define at least one support leg for supporting the component on a circuit board with the body elevated from the circuit board. The component may define a power inductor.

The separately provided circuit board component may include an integrated circuit component. The integrated circuit component may define a power stage of a power converter.

Another embodiment of a surface mount component for a circuit board has been disclosed, including: a magnetic body; at least one conductive coil; and surface mount terminations for completing an electrical connection between the conductive coil and the circuit board, wherein one of the body and the surface mount terminations is configured to accommodate a separately provided component in a vertically stacked relation with the separately provided circuit board component being located between the circuit board and the body.

Optionally, the body may define a recessed area dimensioned to accommodate the separately provided component. The magnetic body may also have a bottom surface, and the bottom surface may be elevated from the circuit board to define an area dimensioned to accommodate the separately provided surface mount component. The magnetic body may include a first magnetic core piece and a second magnetic core piece. The magnetic body may include a physical gap.

The at least one conductive coil may define more than one complete turn of a winding, or alternatively may define less than one complete turn of a winding. The surface mount terminations may be integrally provided on opposing ends of the at least one conductive coil. The coil may define at least one support leg for supporting the component on a circuit board with the body elevated from the circuit board. The magnetic body and the coil may define a power inductor.

The separately provided component may include an integrated circuit component, and the integrated circuit component may define a power stage of a power converter.

An embodiment of a circuit board component assembly has been disclosed including: a first surface mount component including a body and first surface mount terminations, the body including a bottom surface being dimensioned to occupy a first area on a circuit board; and a second component dimensioned to occupy a second area on the circuit board; wherein the first surface mount component is configured to accommodate the second component in a vertically stacked relation to the first surface mount component with the second component between the circuit board and the body of the first component; and wherein the second area is a portion of the first area when the first and second components are mounted to the circuit board.

Optionally, the first surface mount component may define a power inductor. The second component may define an integrated circuit component. The integrated circuit component may define a power stage of a power converter. The body may include a bottom surface having a recessed area dimensioned to accommodate the separately provided component. The body may also include a bottom surface, and the bottom surface may be elevated from the circuit board to define an area dimensioned to accommodate the separately provided surface mount component.

The first surface mount component may include a coil completing at least part of a turn of an inductor winding. The first surface mount terminations may be integrally formed with the coil. The coil may include at least one support leg spaced from the first surface mount terminations.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A surface mount component assembly for a circuit board, comprising:
   a first surface mount component comprising:
      a body comprising a first magnetic core piece and a second magnetic core piece assembled to the first magnetic core piece; and
      a conductive element coupled to the body and including a portion thereof extending between the first magnetic core piece and the second magnetic core piece;
      wherein the conductive element is a C-shaped winding defining less than one complete turn of an inductor winding, the conductive element including first and second surface mount terminations located on the first magnetic core piece for completing an electrical connection through the conductive element to the circuit board; and
      wherein the first magnetic core piece defines a bottom side formed with a three dimensional space dimensioned to accommodate at least a portion of a second circuit board component separately provided from the first surface mount component, the three dimensional space extending between the first and second surface mount terminations on the bottom side, the portion of the second circuit board component accommodated in a vertically stacked relation to the first magnetic core piece when the first surface mount component is mounted to the circuit board with the first magnetic core piece abutting the circuit board.

2. The surface mount component assembly of claim 1, wherein the second magnetic core piece is physically gapped from the first magnetic core piece.

3. The surface mount component assembly of claim 1, wherein the first and second surface mount terminations are integrally provided on opposing ends of the conductive element.

4. The surface mount component assembly of claim 1, wherein the first surface mount component defines a power inductor.

5. The surface mount component assembly of claim 4, wherein the second circuit board component comprises an integrated circuit component.

6. The surface mount component assembly of claim 5, wherein the integrated circuit component defines a power stage of a power converter.

7. A surface mount component assembly for a circuit board, comprising:
   a magnetic body comprising a first magnetic core piece and a second magnetic core piece;

at least one conductive coil in the magnetic body and defining more than one complete turn of a winding, the at least one conductive coil comprising:
  a first planar section extending between the first magnetic core piece and the second magnetic core piece;
  a second planar section extending on a bottom side of the second magnetic core piece in a plane spaced apart from but parallel to the first planar section, wherein the second planar section including a first end and a second end extending generally parallel to but offset from one another on opposing edges of the bottom side; and
  first and second surface mount terminations for completing an electrical connection to the circuit board, wherein the first and second surface mount terminations elevate the bottom side from the circuit board to accommodate a separately provided circuit board component in a vertically stacked relation with the separately provided circuit board component being located between the circuit board and the bottom side.

8. The surface mount component assembly of claim 7, wherein the magnetic body includes a physical gap.

9. The surface mount component assembly of claim 7, wherein the first and second surface mount terminations are integrally provided on opposing ends of the at least one conductive coil.

10. The surface mount component assembly of claim 7, wherein the at least one conductive coil defines at least one support leg for supporting the surface mount component on a circuit board.

11. The surface mount component assembly of claim 7, wherein the magnetic body and the at least one conductive coil define a power inductor.

12. The surface mount component assembly of claim 11, wherein the separately provided circuit board component comprises an integrated circuit component.

13. The surface mount component assembly of claim 12, wherein the integrated circuit component defines a power stage of a power converter.

14. The surface mount component assembly of claim 7, wherein the at least one conductive coil further comprises:
  a third planar section extending between the first magnetic piece and the second magnetic piece, the third planar section being generally coplanar with the first planar section;
  a first end of the second planar section being connected to the first planar section by a fourth planar section extending perpendicularly to each of the first planar section and the second planar section; and
  a second end of the second planar section being connected to the third planar section by a fifth planar section extending perpendicularly to each of the first planar section and the second planar section.

* * * * *